(12) United States Patent
Nakahara

(10) Patent No.: US 6,392,392 B1
(45) Date of Patent: May 21, 2002

(54) OVER-CURRENT DETECTING CIRCUIT

(75) Inventor: Akihiro Nakahara, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/514,383

(22) Filed: Feb. 28, 2000

(30) Foreign Application Priority Data

Mar. 1, 1999 (JP) .......................................... 11-052232

(51) Int. Cl.[7] .............................. G05F 3/04; G05F 3/08; G05F 3/16
(52) U.S. Cl. ........................ 323/312; 232/313; 324/765
(58) Field of Search .............................. 324/102, 103 P, 324/103 R, 158.1, 765; 323/312, 313

(56) References Cited

U.S. PATENT DOCUMENTS

| | | | | |
|---|---|---|---|---|
| 4,439,743 A | * | 3/1984 | Schwarz et al. | ............ 330/267 |
| 4,982,192 A | * | 1/1991 | Murooka | ..................... 341/127 |
| 5,343,141 A | * | 8/1994 | Metro et al. | ................. 323/288 |
| 5,786,970 A | * | 7/1998 | Nao et al. | ...................... 361/18 |
| 5,834,984 A | * | 11/1998 | Tsugita | ........................ 331/111 |
| 6,008,632 A | * | 12/1999 | Sasaki | ......................... 323/313 |
| 6,265,857 B1 | * | 7/2001 | Demsky et al. | ............. 323/312 |

FOREIGN PATENT DOCUMENTS

| | | | |
|---|---|---|---|
| JP | 2-87817 | * | 3/1990 |
| JP | 9-138247 | | 5/1997 |

* cited by examiner

*Primary Examiner*—Michael J. Sherry
*Assistant Examiner*—Paresh Patel
(74) *Attorney, Agent, or Firm*—Young & Thompson

(57) ABSTRACT

An over-current detecting circuit (OCD Circuit) for comparing a voltage drop by an ON-state resistance of an output transistor with a reference voltage, to detect an over-current state of the output transistor. This OCD Circuit is provided with a first power source and an RVG Circuit, which outputs a first reference voltage on the basis of a voltage supplied from the first power source. The OCD Circuit is also provided with a constant-current source which generates a constant current having a second temperature characteristic on the basis of the first reference voltage, and a current mirror circuit which inputs the constant current. Moreover, the OCD Circuit is provided with a current-voltage converting circuit, which converts an output current from the current mirror circuit, to a voltage and outputs a reference voltage which has a temperature characteristic in proportion to the second temperature characteristic. A first temperature characteristic of the output transistor is compensated by the temperature characteristic of the reference voltage.

3 Claims, 6 Drawing Sheets

OVER-CURRENT DETECTING CIRCUIT

BACKGROUND OF THE INVENTION

1. Field of the Invention

The present invention relates to an over-current detecting circuit (thereafter, "over-current detecting circuit" is abbreviate to "OCD Circuit".) for detecting the over-current state of an output transistor having an open drain structure, and a semiconductor integrated circuit (SI Circuit) having the OCD Circuit built-in.

2. Description of the Related Art

In many cases, SI Circuits which drive a solenoid or the like have therein an output transistor having an open drain structure. In such SI Circuits, a large current passes through the output transistor which frequently destroys the output transistor when an external load such as either a solenoid suffers catastrophic failure or the state of an external power source varies abnormally. In order to prevent such failure, it is necessary to have a mechanism for monitoring the amount of current that passes through the output transistor at all times and immediately sever the current towards the output transistor when detected that the current is in an over-current state. A circuit including such a mechanism is called an OCD Circuit. The following will describe a conventional SI Circuit having this mechanism built-in.

FIG. 1 is a conventional view showing an SI Circuit disclosed in Japanese Patent Application Laid-Open No. 2-87817.

An SI Circuit 70, disclosed in the above-mentioned publication, is a device for controlling whether or not a driving current is supplied to the load $R_L'$ which connects an output terminal 73 and the external power source $V_B'$. And the SI Circuit 70 operates in accordance with an input signal supplied to the input terminal 76 from the outside. Whether or not the driving current is supplied to the load $R_L'$ is decided by whether output transistor $Q_{71}$, which has an open drain structure, is in a state of conduction or non-conduction. The output transistor $Q_{71}$ is controlled by a logic circuit 75, which receives the input signal. That is, if the logic circuit 75 outputs a high-level signal in response to the input signal, the output transistor $Q_{71}$ becomes conductive, and consequently passes the driving current through the load $R_L'$. On the other hand, if the logic circuit 75 outputs a low-level signal in response to the input signal, the output transistor $Q_{71}$ becomes nonconductive, thus severing the supply of the driving current toward the load $R_L'$.

However as previously described, in the case that either the load $R_L'$ short-circuits or an abnormally high voltage is generated in the external power source $V_B'$, an unexpected large current is sent in the conductive state to output transistor $Q_{71}$ and it may be destroyed. To prevent this, the SI Circuit 70 has an OCD Circuit, comprised of reference voltage generating circuit (RVG Circuit) 71, resistors $R_{75}$ and $R_{76}$, diodes $D_{71}$–$D_{7n}$, and a comparator 72. Such an OCD Circuit is a circuit for detecting an over-current state of the transistor $Q_{71}$ and for comparing the voltage at the output terminal 73 with a reference voltage $V_r'$.

The reference voltage $V_r'$ for detecting the over-current, can be obtained by dividing the output voltage from the RVG Circuit 71 through a voltage divider wherein the resistors $R_{75}$ and $R_{76}$ and n diodes $D_{71}$–$D_{7n}$ are connected in series. The comparator 72 continually compares the reference voltage $V_r'$ with the output voltage from the output transistor $Q_{71}$, so that whenever the detection of an over-current is found on the basis of an abnormal rise in the output voltage from the output transistor $Q_{71}$. The over-current detecting terminal 74 outputs an over-current detecting signal. The over-current detecting signal is fed back to the logic circuit 75 to trigger the output transistor $Q_{71}$ into an OFF-state. As a result, the output transistor $Q_{71}$ is protected from destruction based on an over-current.

The diodes $D_{71}$–$D_{7n}$ are set to compensate the temperature characteristic of the ON-state resistance of the output transistor $Q_{71}$. For this reason, any over-current is detected under good dependency at any temperature.

An output voltage $V_{BG}'$ from the RVG Circuit 71 is also used for detecting temperature by a temperature detecting circuit. Therefore, dependency, (contingent of the output voltage $V_{BG}'$ from the RVG Circuit 71) of the temperature must be small. It is impossible to cause the output voltage $V_{BG}'$, itself, of the RVG Circuit 71 to have a temperature characteristic for compensating the temperature characteristic of the output transistor $Q_{71}$. For this reason, in order to perform over-current-detection with good dependency upon temperature, the diodes in series are used to generate the reference voltage $V_r'$, which has the same temperature characteristic as the output transistor $Q_{71}$ by using the output voltage $V_{BG}'$ having no dependency upon temperature.

However, the reference voltage $V_r'$ for detecting an over-current is generated from a voltage divider to which the diodes $D_{71}$–$D_{7n}$ and $R_{75}$ and $R_{76}$ are connected in series, causing a problem that the range wherein detection values thereof are set, is limited to a low range by a voltage-drop at the diodes connected in series.

For example, in the case that 5 diodes are used, the reference voltage $V_r'$ for detecting an over-current, is limited to lower than the output voltage $V_{BG}'$ from the RVG Circuit 71, by the forward direction voltage reduced through the 5 diodes.

For this reason, the margin for setting the detection range is low. As the case may be, in order to obtain a desired reference voltage, it is necessary to sacrifice the temperature characteristic to some degree. Alternatively, in order to obtain a desired temperature characteristic, it is necessary to shift the reference voltage from a desired value by some degree.

SUMMARY OF THE INVENTION

The object of the present invention is to provide an OCD Circuit, making it possible to set the value for over-current detection to a desired value, while compensating the temperature characteristic of an output transistor sufficiently, with the SI Circuit having the detecting circuit.

According to one aspect of the present invention, an OCD Circuit is a circuit for comparing a voltage drop by an ON-state resistance of an output transistor with a reference voltage to detect an over-current state of the output transistor. The OCD Circuit comprises a first power source and an RVG Circuit which outputs a first reference voltage on the basis of a voltage supplied from the first power source. The OCD Circuit also comprises a constant-current source, which generates a constant current having a second temperature characteristic on the basis of the first reference voltage, and a current mirror circuit which inputs the constant current. Moreover, the OCD Circuit comprises a current-voltage converting circuit, which converts an output current from the current mirror circuit to a voltage then outputs a reference voltage having a temperature characteristic in proportion to the second temperature characteristic. A first temperature characteristic of the output transistor is compensated by the temperature characteristic of the reference voltage.

According to another aspect of the present invention, an OCD Circuit is a circuit for detecting an over-current passing through an output transistor which connects an output terminal and a power source. The OCD Circuit comprises a constant-current source which generates a first constant current having a given temperature characteristic on the basis of a reference voltage. The given temperature characteristic is substantially equal to a temperature characteristic of the output transistor. The OCD Circuit also comprises a current mirror circuit which generates a second constant current on the basis of the first constant current, and a current-voltage converting circuit which generates a reference voltage on the basis of the second constant current. Moreover the OCD Circuit comprises a comparator which compares the reference voltage with the voltage at the output terminal.

According to another aspect of the present invention, an SI Circuit comprises an output transistor which connects an output terminal and a power source, an OCD Circuit which detects a current passing through the output transistor, and a logic circuit which controls a conduction state of the output transistor on the basis of an input signal. The OCD Circuit has a constant-current source which generates a first constant current having a given temperature characteristic on the basis of a reference voltage. The given temperature characteristic is substantially equal to a temperature characteristic of the output transistor. The OCD Circuit also has a current mirror circuit which generates a second constant current on the basis of the first constant current, and a current-voltage converting circuit which generates a reference voltage on the basis of the second constant current. Moreover, the OCD Circuit has a comparator which compares the reference voltage with a voltage at the output terminal. The logic circuit causes the output transistor to be in a nonconductive state in response to generation of an output signal from the comparator, whether the input signal is inputted or not.

DESCRIPTION OF THE PREFERRED EMBODIMENTS

Figure 1:
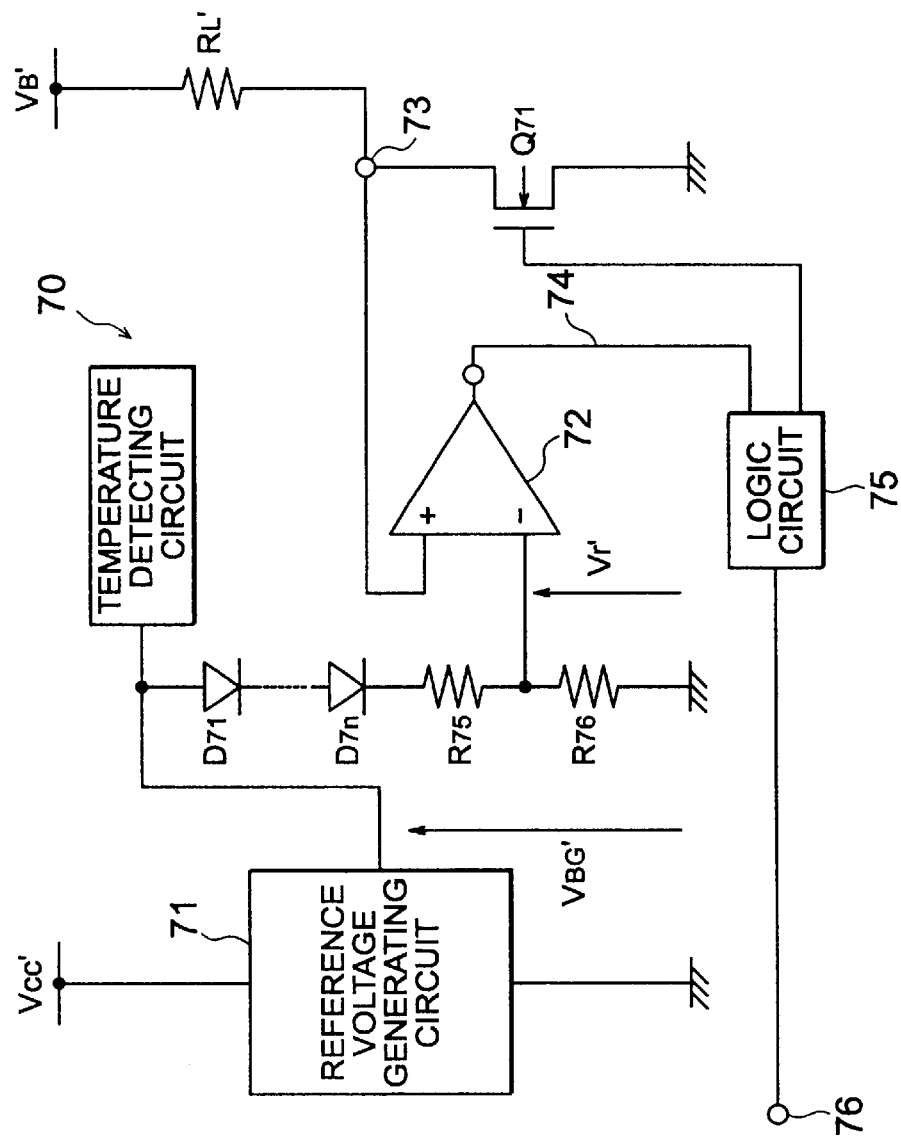
FIG. 1 is an example of conventional OCD Circuits.

Referring to the drawings, OCD Circuits according to embodiments of the present invention and SI Circuits having these detecting circuits built-in will be specifically described hereinafter.

Figure 2:
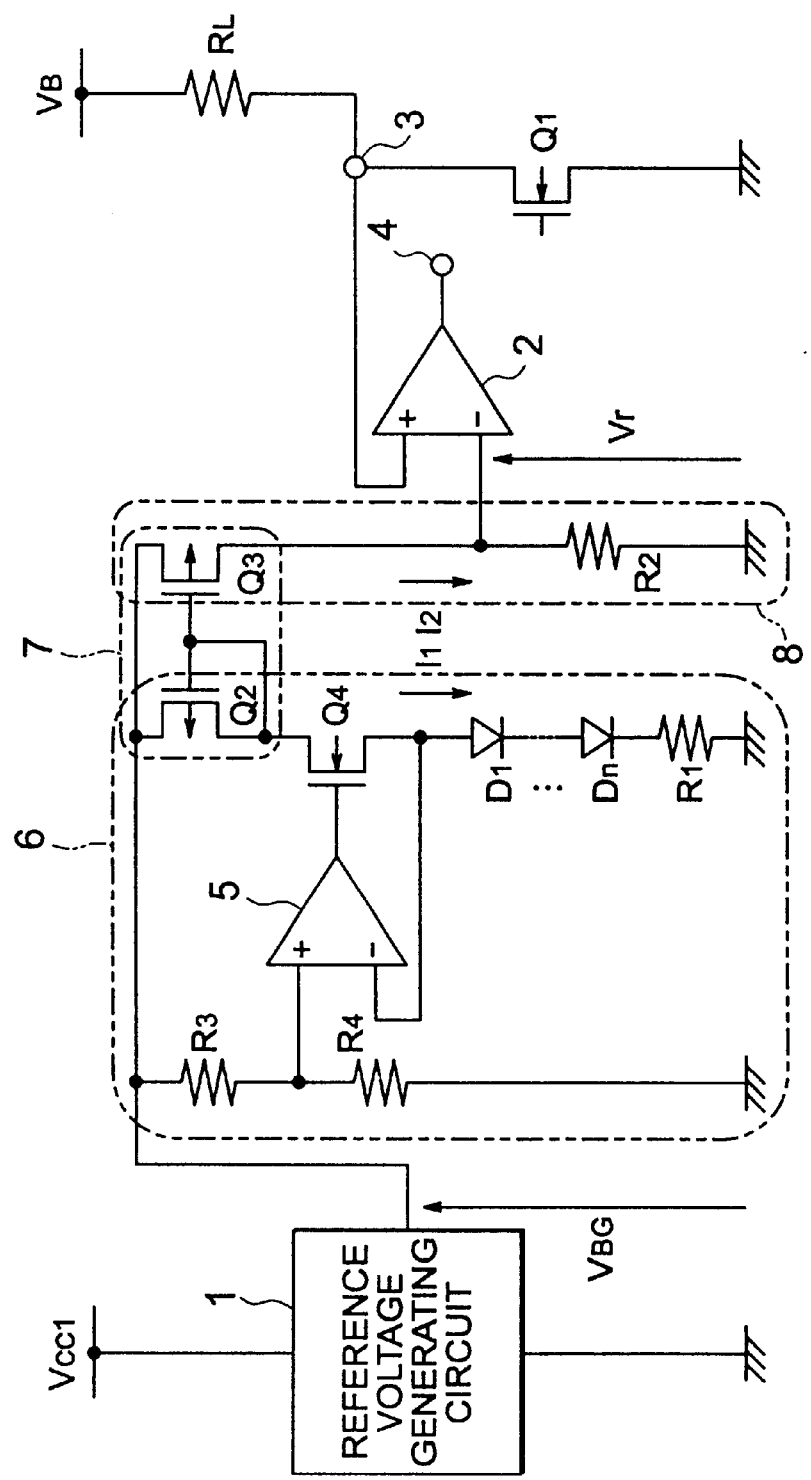
FIG. 2 is a circuit diagram showing an OCD Circuit according to a first embodiment of the present invention.

FIG. 2 is a circuit diagram showing an OCD Circuit according to a first embodiment of the present invention.

Figure 3:
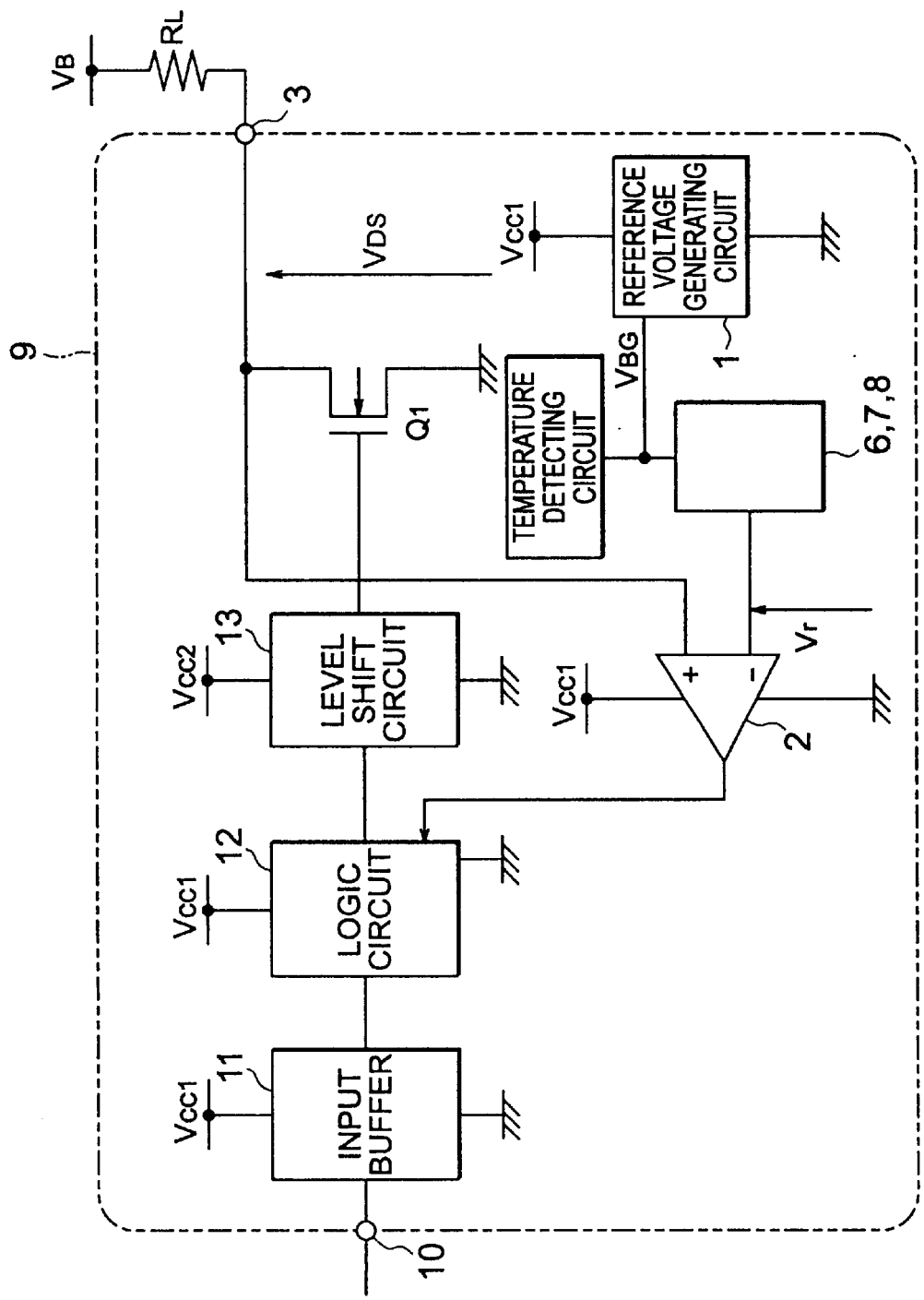
FIG. 3 is a view showing a SI Circuit which has the OCD Circuit according to the first embodiment of the present invention.

FIG. 3 is a view showing the outline of the whole of a SI Circuit having the detecting circuit built-in.

As shown in FIG. 3, an SI Circuit 9 is provided with an input terminal 10 and an output terminal 3. An output transistor $Q_1$ is connected between the output terminal 3 and a ground. In other words, the output transistor $Q_1$ has an open drain structure, and an external load $R_L$ to be driven is connected the output terminal 3, corresponding to the drain of the output transistor $Q_1$ and an external power source for a power source voltage $V_B$. The external load $R_L$ is, for example, a solenoid, but is not especially limited thereto.

An input signal supplied to the input terminal 10 is first inputted to an input buffer 11, and then is subjected to a given processing at a logic circuit 12. As shown in FIG. 3, the logic circuit 12 is driven by the voltage between $V_{cc1}$ and the ground, so that the amplitude of the output has a level of $V_{cc1}$. The output signal, derived from the logic circuit 12, which has the amplitude of the $V_{cc1}$ level is applied to a level shift circuit 13 and converted into a signal which has an amplitude of a $V_{cc2}$ level therein. Thus the converted signal is applied to the gate electrode of the output transistor $Q_1$ to switch the output transistor $Q_1$ into a conductive or nonconductive state.

The voltages $V_{cc1}$ and $V_{cc2}$, which are not especially limited, are 5V and 12V, respectively. The external power source voltage $V_B$, which is not especially limited, is 12V, which is equal to the voltage $V_{cc2}$. When the power source voltage $V_B$ at the external power source connected to the external load $R_L$ is as high as described above, the ON-state resistance of the output transistor $Q_1$ can be sufficiently reduced by using the level shift circuit 13 making the amplitude of the signal for driving the output transistor $Q_1$ large. Accordingly, the level shift circuit 13 is unnecessary in the case that the power source voltage $V_B$ is not very high or the ON-state resistance of the output transistor $Q_1$ is sufficiently small. In such a case, the output signal from the logic circuit 12 is directly applied to the gate electrode of the output transistor $Q_1$.

As shown in FIG. 3, the SI Circuit 9 is provided with an OCD Circuit for detecting whether or not the electric current which passes through the output transistor $Q_1$ is in a permissible range. The details of the OCD Circuit are as shown in FIG. 2. That is, the OCD Circuit is provided with an RVG Circuit 1, a comparator 2, a constant-current source circuit 6, a current mirror circuit 7 and a current-voltage converting circuit 8.

The RVG Circuit 1 is a circuit for generating a reference voltage $V_{BG}$. As shown in FIG. 3, the reference voltage $V_{BG}$ is used not only for the current detecting circuit but also for a temperature detecting circuit. Therefore, the reference voltage $V_{BG}$ does not have any dependency upon temperature, and is a stable voltage. It should be noted that the temperature detecting circuit is an example of another use of the reference voltage $V_{BG}$, and it is not essential for the present embodiment to have the temperature detecting circuit. The reference voltage $V_{BG}$ may be used only for the OCD Circuit.

The constant-current source circuit 6 is a circuit for generating a constant current $I_1$ on the basis of the reference voltage $V_{BG}$. As shown in FIG. 2, the constant-current source circuit 6 is composed of, for example, transistors $Q_2$ and $Q_4$, resistors $R_1$, $R_3$ and $R_4$, an operation amplifier 5 and n diodes $D_1$–$D_n$ for compensating temperature. The diodes $D_1$–$D_n$ are temperature compensating elements for making the temperature characteristics of the output transistor $Q_1$ and that of the constant current $I_1$ consistent with each other.

The current mirror circuit 7 is a circuit to which the constant current $I_1$ generated by the constant-current source circuit 6 is inputted and which supplies a constant current $I_2$ on the basis of the inputted current $I_1$ to the current-voltage converting circuit 8. Therefore, if the sizes of the transistors $Q_2$ and $Q_3$ are equal to each other, the current $I_1$ becomes equal to the current $I_2$. In the present invention, however, it is not necessarily essential to make the dimensions of the transistors $Q_2$ and $Q_3$ equal to each other.

The current-voltage converting circuit 8 is a circuit for converting the constant current $I_2$ supplied from the current mirror circuit 7 into a reference voltage $V_r$ by using a resistor $R_2$.

As shown in FIGS. 2 and 3, the reference voltage $V_r$ generated by the current-voltage converting circuit 8 is inputted to an inverting input terminal (−) of the comparator 2 and the voltage generated at the output terminal 3 is inputted to a noninverting input terminal (+) of the comparator 2. On the basis of these voltages, the comparator 2 generates a detection signal 4. That is, the comparator 2 causes the detection signal 4 to be at a low level when the voltage at the output terminal 3 is lower than the reference voltage $V_r$, and the comparator 2 causes the detection signal 4 to be at a high level when the voltage at the output terminal 3 is higher than the reference voltage $V_r$.

As shown in FIG. 3, the detection signal 4 is supplied to the logic circuit 12.

The following will more specifically describe the operation of the OCD Circuit according to the first embodiment of the present invention.

The output voltage $V_{BG}$ from the RVG Circuit 1 is divided by the resistors $R_3$ and $R_4$, to generate a reference voltage. The reference voltage is inputted to the operation amplifier 5, and the output from the operation amplifier 5 is inputted to the gate terminal of the transistor $Q_4$. At this time, the signal at the source terminal of the transistor $Q_4$ is fed back to the operation amplifier 5, so that the source voltage is kept constant. Since the diodes $D_1$–$D_n$ and resistor $R_1$ are connected between the source and the ground, the constant current $I_1$ represented by the following equation (1) passes:

$$I_1 = ((R_4/(R_3+R_4))V_{BG} - nV_F)/R_1 [A] \quad (1)$$

wherein n is the number of the diodes and $V_F$ is a forward direction voltage at the diode. Since the transistors $Q_2$ and $Q_3$ constitute the current mirror circuit 7, the mirror current $I_2$ corresponding to the area ratio of these transistors passes through the transistor $Q_3$. When the size ratio of the transistor $Q_3$ to the transistor $Q_2$ is represented by m, the mirror current $I_2$ is converted to the reference voltage $V_r$ obtained by the following equation (2) through the resistor $R_2$.

$$V_r = (mR_2/R_1) \times ((R_4/(R_3+R_4))V_{BG} - nV_F)[V] \quad (2)$$

In order that the transistors $Q_2$ and $Q_3$ are operated as the current mirror circuit, it is necessary to satisfy the following inequality (3).

$$(R_3/(R_3+R_4))V_{BG} < V_{BG} - V_T [V] \quad (3)$$

The temperature coefficient of the reference voltage $V_r$ is represented, from the equation (2), by the following equation.

$$(\delta V_r/\delta T) = -(nmR_2/R_1) \times (\delta V_F/\delta T)[V/^\circ C.] \quad (4)$$

Figure 4:
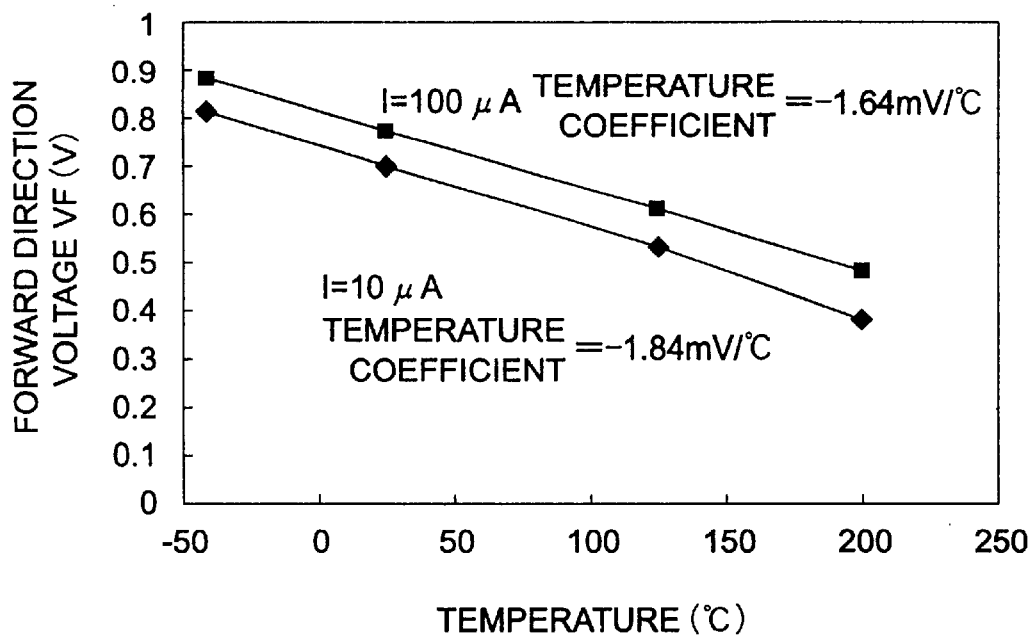
FIG. 4 is a graph showing the temperature characteristic of the forward direction voltage $V_F$ at the diode shown in FIG. 2.

FIG. 4 is a graph showing the temperature characteristic of the forward direction voltage $V_F$ at the diode. The reference voltage $V_r$ has a temperature characteristic of such a diode as shown in FIG. 4.

When the value of a detection current is represented by $I_S$ the voltage drop $V_{DS}$ at the output transistor $Q_1$ is represented by $I_S \times R_{on}$. The temperature coefficient of the voltage drop $V_{DS}$ is represented by the following equation (5).

$$(\delta V_{DS}/\delta T) = I_S \times (\delta R_{on}/\delta T)[V/^\circ C.] \quad (5)$$

Figure 5:
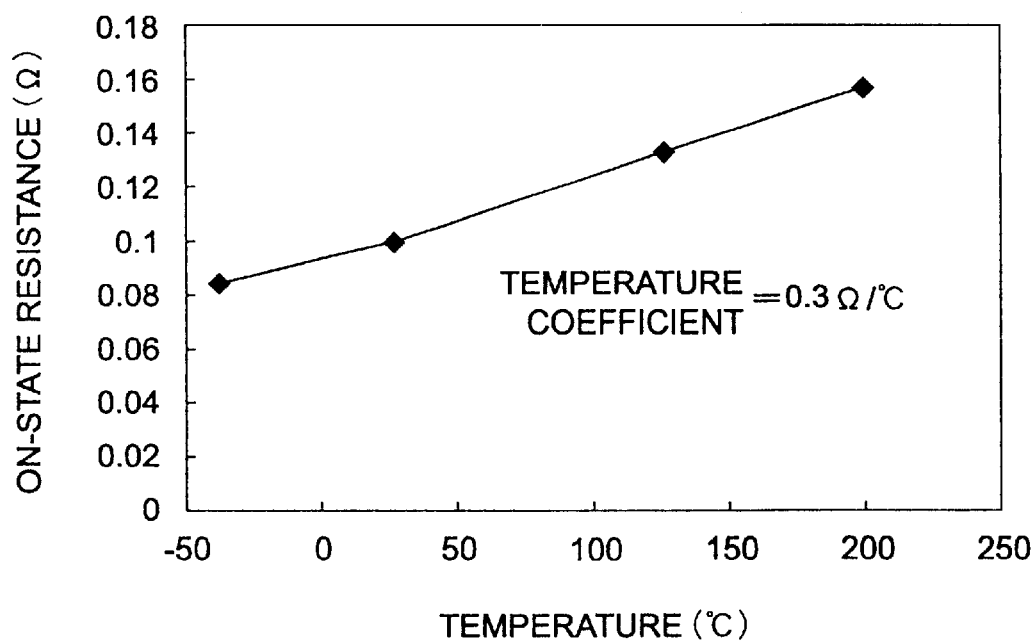
FIG. 5 is a graph showing the temperature characteristic of the ON-state resistance $R_{on}$ of the output transistor $Q_1$ shown in FIG. 2.

FIG. 5 is a graph showing the temperature characteristic of an ON-state resistance $R_{on}$ measured about an N-channel type MOSFET. The voltage drop $V_{DS}$ at the output transistor $Q_1$ has such a temperature characteristic of the ON-state resistance as shown in FIG. 5. In order to perform temperature-compensation, it is sufficient that the temperature coefficient of the voltage drop $V_{DS}$ at the output transistor $Q_1$ is equal to the temperature coefficient of the reference voltage. Therefore, from the equations (4) and (5), the number of the diodes may be selected as an integer nearest the value N obtained by the following equation (6).

$$N = -(R_1 \times I_S / mR_2) \times (67 R_{on}/\delta T)/(\delta V_F/\delta T) \quad (6)$$

The reference voltage $V_r$ may be obtained by adjusting parameters within the range satisfying the inequality (3).

As described above, the reference voltage $V_r$ is decided by the mirror current $I_2$ of the constant current $I_1$, which has the temperature characteristic of the diodes generated at the constant-current source circuit 6 for obtaining a constant current, and the resistor $R_2$. For this reason, the range of the reference voltage $V_r$ can be freely set without any influence by the voltage drop at the diodes. Therefore, the detection current range can be made wide regardless of the number of the diodes by adjusting the current mirror ratio and resistor ratio.

When the comparator 2 detects an over-current passing through the output transistor $Q_1$ on the basis of the reference voltage $V_r$ generated in this manner and the voltage generated at the output terminal 3, the comparator 2 causes the detection signal 4 to be at a high level as described above. In response to this, regardless of the input signal the logic circuit 12 forces causes the output based thereon to be at a low level, so that the output transistor $Q_1$ becomes nonconductive. Thus, the supply of any current to the external load $R_L$ is severed to protect the output transistor $Q_1$ from the destruction based on any over-current.

As described above, according to the first embodiment, the reference voltage $V_r$ can be set without any influence by the voltage drop at the diodes that are temperature compensating elements. Therefore, the over-current detection value can be set to a desired value while the temperature characteristic of the output transistor $Q_1$ is sufficiently compensated.

Figure 6:
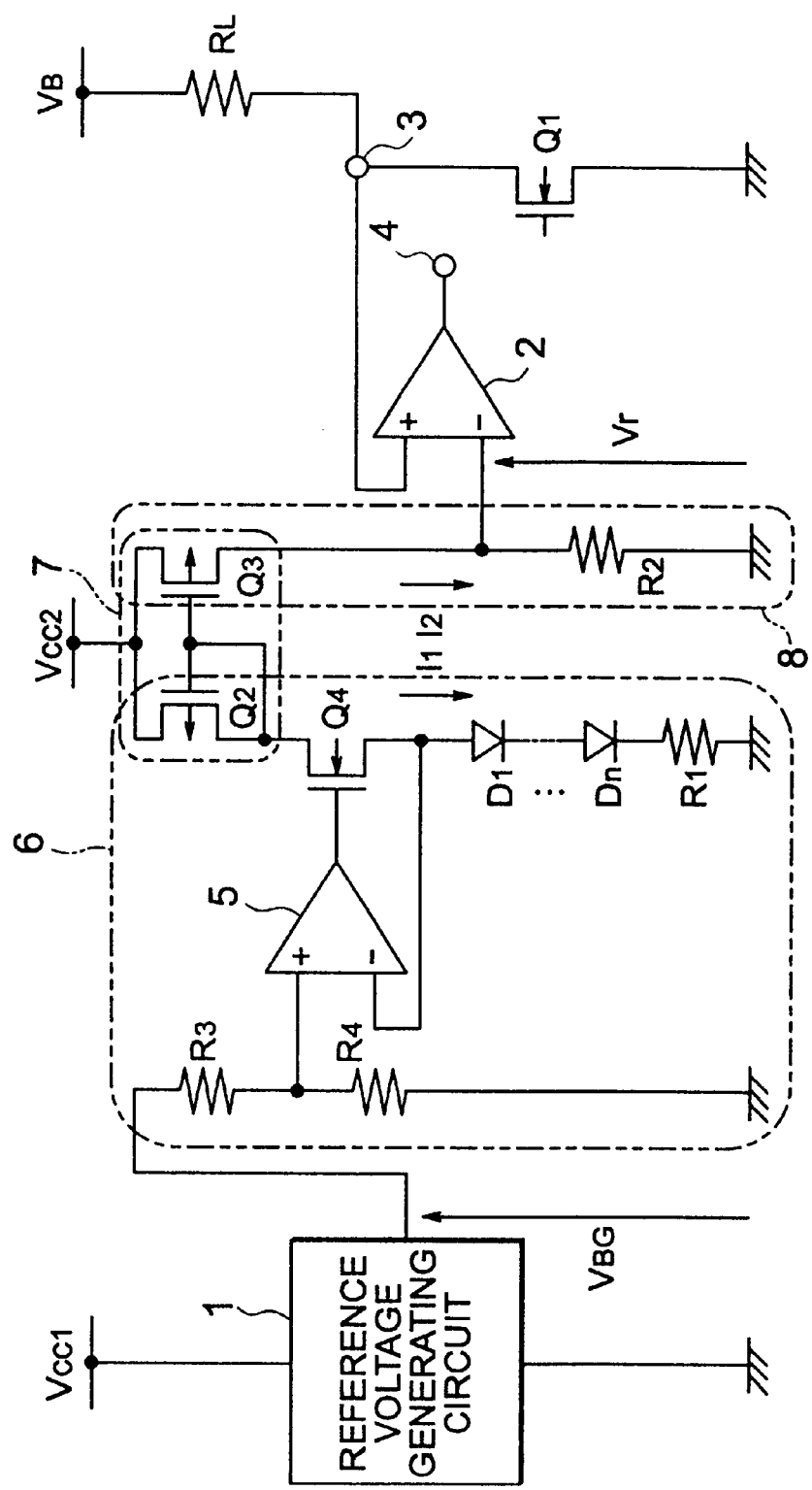
FIG. 6 is a circuit diagram showing an OCD Circuit according to a modification of the first embodiment of the present invention.

In the embodiment shown in FIG. 2, the reference voltage $V_{BG}$ is used as an operation voltage for the current mirror circuit 7, but the operation voltage is not limited therein the present invention. As shown in FIG. 6, a voltage $V_{cc2}$ may be used. In this case, the range of the set reference voltage $V_r$ can set at a high voltage near the voltage $V_{cc2}$. The operation voltage is not limited these voltages in the present invention. The operation voltage for the current mirror circuit 7 may be other voltages, such as a voltage $V_{cc1}$.

The following will describe a second embodiment of the present invention.

Figure 7:
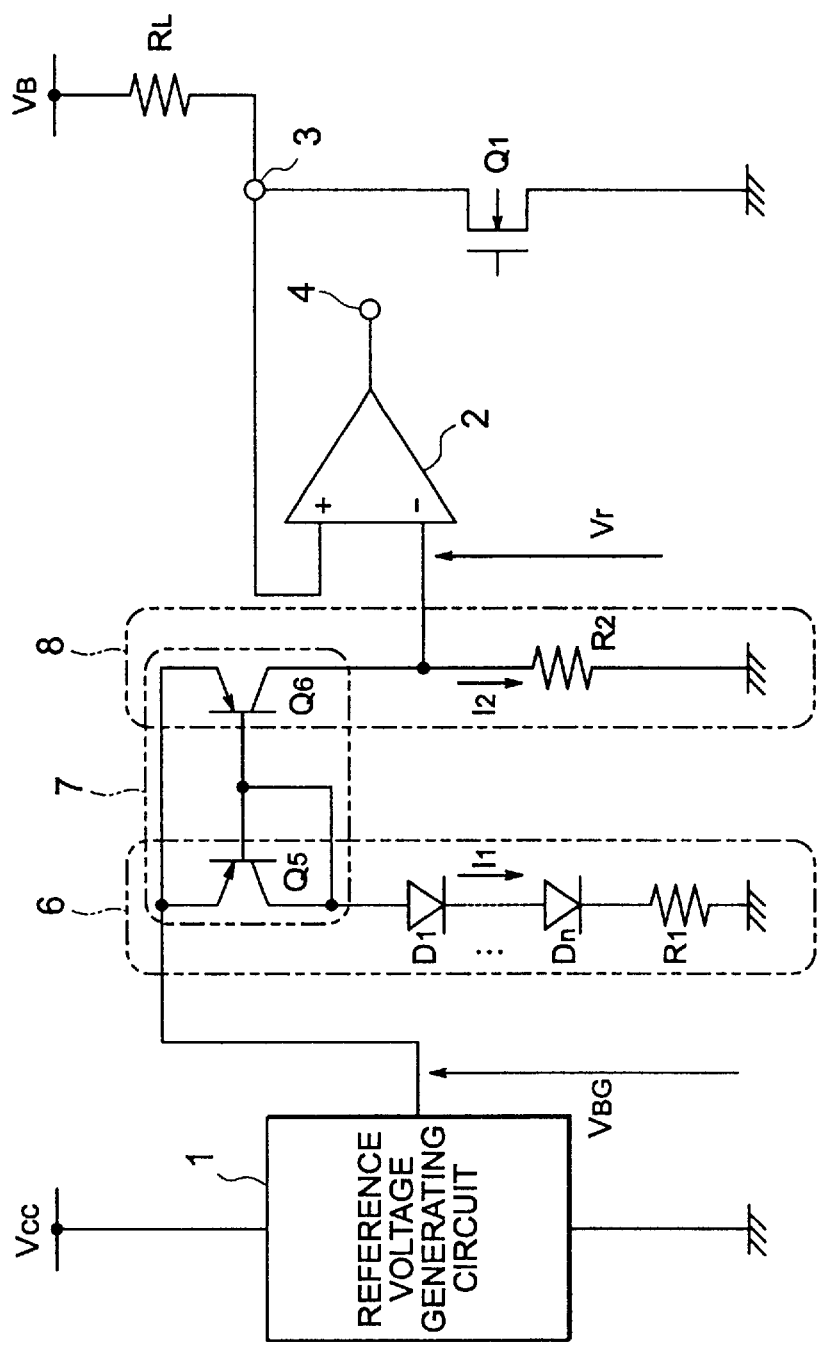
FIG. 7 is a circuit diagram showing an OCD Circuit according to a second embodiment of the present invention.

FIG. 7 is a circuit diagram showing an OCD Circuit according to the second embodiment of the present invention.

The OCD Circuit according to the second embodiment is composed of an RVG Circuit 1, a transistor $Q_1$, bipolar transistors $Q_5$ an $Q_6$, resistors $R_1$ and $R_2$, a comparator 2 and n diodes $D_1$–$D_n$ for compensating temperature.

The collector voltage at the transistor $Q_5$ constituting a current mirror circuit becomes equal to the voltage between the base and the emitter. Since this voltage is a constant, fixed only by physical parameters, the collector voltage becomes constant. In the present embodiment, therefore, any operation amplifier is unnecessary. As a result, the current $I_1$ passing through the diodes and the resistors becomes stable to generate a constant mirror current having a temperature characteristic in proportion to the temperature characteristic of the diodes. Since the mirror current $I_2$ has the temperature characteristic in proportion to the temperature characteristic of the diodes, the reference voltage $V_r$ also has the same temperature characteristics. Accordingly, the detection current range can be made wide regardless of the number of the diodes by adjusting the current mirror ratio and the resistor ratio.

In the present embodiment, other currents may be used as an operation voltage for the current mirror circuit 7.

As described above, according to the present invention, the reference voltage can be set without any influence by the voltage drop at the diodes that are temperature-compensating elements. Therefore, the value for over-current-detection can be set to a desired value while the temperature characteristic of the output transistor is sufficiently compensated. In other words, the reference voltage can easily be changed by adjusting the number of the diodes, the current mirror ratio and the resistor ratio, so that the margin for setting the detection current range is enlarged.

What is claimed is:

1. A semiconductor integrated circuit comprising:
    an output transistor connected between an output terminal and a power source;
    an OCD circuit which detects a current passing through said output transistor, said OCD circuit having:
    a constant-current source which generates a first constant current having a given temperature characteristic on the basis of a reference voltage, said given temperature characteristic being substantially equal to a temperature characteristic of said output transistor;
    a current mirror circuit which generates a second constant current on the basis of said first constant current;
    a current-voltage converting circuit which generates a reference voltage on the basis of said second constant current; and
    a comparator which compares said reference voltage with a voltage at said output terminal; and a logic circuit which controls a conduction state of
    said output transistor on the basis of an input signal, said logic circuit causing said output transistor to be in a nonconductive state in response to generation of an output signal from said comparator, whether said input signal is inputted or not;
    wherein the constant-current source comprises n diodes connected in series with a first resistor, the current-voltage converting circuit comprises a second resistor, and wherein n is an integer nearest a value N defined as follows:

$$N = -(R_1 \times I_S / mR_2) \times (\delta R_{on}/\delta T)/(\delta V_F/\delta T);$$

wherein:
    $R_1$ is a resistance of the first resistor;
    $R_2$ is a resistance of the second resistor;
    m is a transfer characteristic of the current mirror circuit;
    $I_s$ is a current flowing through the output transistor;
    $\delta R_{on}/\delta T$ is a temperature coefficient of an ON-state resistance of the output transistor; and
    $\delta V_F/\delta T$ is a temperature coefficient of a forward direction voltage of each said diode.

2. A temperature-compensated OCD circuit comprising:
    an output transistor having a first temperature characteristic;
    a first power source;
    a reference voltage generating circuit powered by the first power source, the reference voltage generating circuit providing as an output a first reference voltage;
    a constant-current source powered by the first reference voltage which generates a constant current having a second temperature characteristic;
    a current mirror circuit which provides an output current based on said constant current; and
    a current-voltage converting circuit which converts the output current from said current mirror circuit to a voltage and outputs an output-controlling reference voltage having a third temperature characteristic in proportion to said second temperature characteristic of the constant current source, the output-controlling reference voltage being used to control the output transistor;
    wherein the constant-current source is constructed so that the second temperature characteristic of the constant-current source compensates for the first temperature characteristic of said output; and
    wherein the constant-current source comprises n diodes connected in series with a first resistor, the current-voltage converting circuit comprises a second resistor, and wherein n is an integer nearest a value N defined as follows:

$$N = -(R_1 \times I_S / mR_2) \times (\delta R_{on}/\delta T)/(\delta V_F/\delta T);$$

wherein:
    $R_1$ is a resistance of the first resistor;
    $R_2$ is a resistance of the second resistor;
    m is a transfer characteristic of the current mirror circuit;
    $I_s$ is a current flowing through the output transistor;
    $\delta R_{on}/\delta T$ is a temperature coefficient of an ON-state resistance of the output transistor; and
    $\delta V_F/\delta T$ is a temperature coefficient of a forward direction voltage of each said diode.

3. An OCD circuit for detecting an over-current passing through an output transistor connected between an output terminal and a power source, comprising:
    a constant-current source which generates a first constant current having a given temperature characteristic on the basis of a reference voltage, said given temperature characteristic being substantially equal to a temperature characteristic of said output transistor;
    a current mirror circuit which generates a second constant current on the basis of said first constant current;
    a current-voltage converting circuit which generates a reference voltage on the basis of said second constant current; and
    a comparator which compares said reference voltage with a voltage at said output terminal;
    wherein the constant-current source comprises n diodes connected in series with a first resistor, the current-voltage converting circuit comprises a second resistor, and wherein n is an integer nearest a value N defined as follows:

$$N = -(R_1 \times I_S/mR_2) \times (\delta R_{on}/\delta T)/(\delta V_F/\delta T);$$

wherein:
$R_1$ is a resistance of the first resistor;
$R_2$ is a resistance of the second resistor;
m is a transfer characteristic of the current mirror circuit;
$I_S$ is a current flowing through the output transistor;
$\delta R_{on}/\delta T$ is a temperature coefficient of an ON-state resistance of the output transistor; and
$\delta V_F/\delta T$ is a temperature coefficient of a forward direction voltage of each said diode.

* * * * *